US010732314B2

(12) United States Patent
Venkataramanan et al.

(10) Patent No.: US 10,732,314 B2
(45) Date of Patent: Aug. 4, 2020

(54) ESTIMATION OF PETROPHYSICAL AND FLUID PROPERTIES USING INTEGRAL TRANSFORMS IN NUCLEAR MAGNETIC RESONANCE

(75) Inventors: Lalitha Venkataramanan, Lexington, MA (US); Tarek M. Habashy, Burlington, MA (US); Fred K. Gruber, Boston, MA (US); Denise E. Freed, Newton Highlands, MA (US)

(73) Assignee: Schlumberger Technology Corporation, Sugar Land, TX (US)

(*) Notice: Subject to any disclaimer, the term of this patent is extended or adjusted under 35 U.S.C. 154(b) by 947 days.

(21) Appl. No.: 13/333,232

(22) Filed: Dec. 21, 2011

(65) Prior Publication Data

US 2013/0060474 A1  Mar. 7, 2013

Related U.S. Application Data

(60) Provisional application No. 61/530,234, filed on Sep. 1, 2011.

(51) Int. Cl.

| | |
|---|---|
| *G01V 3/175* | (2006.01) |
| *G01R 33/50* | (2006.01) |
| *G01N 24/08* | (2006.01) |
| *G01V 1/48* | (2006.01) |
| *G01V 3/14* | (2006.01) |
| *G01V 3/32* | (2006.01) |

(52) U.S. Cl.
CPC .......... *G01V 3/175* (2013.01); *G01N 24/081* (2013.01); *G01R 33/50* (2013.01); *G01V 1/48* (2013.01); *G01V 3/14* (2013.01); *G01V 3/32* (2013.01)

(58) Field of Classification Search
CPC . G01V 3/175; G01V 3/32; G01V 3/14; G01V 1/48; G01N 24/08; G01N 24/081; G01R 33/448; G01R 33/50

USPC .................................................. 702/6
See application file for complete search history.

(56) References Cited

U.S. PATENT DOCUMENTS

| | | | | |
|---|---|---|---|---|
| 5,363,041 A | * | 11/1994 | Sezginer | 324/303 |
| 6,225,803 B1 | * | 5/2001 | Chen | G01N 24/081 |
| | | | | 324/300 |

(Continued)

OTHER PUBLICATIONS

Shen, Wen; "Lecture Notes for Laplace Transform"; Apr. 2009, pp. 1-23.*

(Continued)

*Primary Examiner* — Gregory J Toatley, Jr.
*Assistant Examiner* — Terence E Stifter, Jr.

(57) ABSTRACT

Apparatus and method of characterizing a subterranean formation including observing a formation using nuclear magnetic resonance measurements, calculating an answer product by computing an integral transform on the indications in measurement-domain, and using answer products to estimate a property of the formation. Apparatus and a method for characterizing a subterranean formation including collecting NMR data of a formation, calculating an answer product comprising the data, wherein the calculating comprises a formula $$K(x) \equiv \int_0^\infty k(t)e^{-t/x}dt.$$

and estimating a property of the formation using the answer product.

17 Claims, 7 Drawing Sheets

(56) References Cited

U.S. PATENT DOCUMENTS

| | | | | |
|---|---|---|---|---|
| 6,600,315 | B1* | 7/2003 | Heaton | G01N 24/081 324/303 |
| 7,286,937 | B2* | 10/2007 | Goswami et al. | 702/11 |
| 2002/0175682 | A1* | 11/2002 | Chen et al. | 324/303 |
| 2004/0066194 | A1* | 4/2004 | Slade et al. | 324/318 |
| 2005/0104587 | A1* | 5/2005 | Akkurt | 324/303 |
| 2007/0114996 | A1* | 5/2007 | Edwards | G01R 33/4831 324/303 |
| 2010/0268753 | A1* | 10/2010 | Fujiwara | G06F 17/14 708/400 |
| 2011/0234220 | A1* | 9/2011 | Mitchell | G01N 24/081 324/303 |

OTHER PUBLICATIONS

Allen et al., "How to Use Borehole Nuclear Magnetic Resonance," Oilfield Review, Summer 1997: pp. 34-57.

Borgia et al., "A Robust Method for Calculating Geometric Mean Times from Multiexponentional Relaxation Data, Using only a Few Data Points and Only a Few Elementary Operations," Magnetic Resonance Imaging, 1996, vol. 14 (7/8): pp. 895-897.

Borgia et al., "Different 'average' nuclear magnetic resonance relaxation times for correlation with fluid-flow permeability and irreducible water saturation in water-saturated sandstones," J. Appl. Phys., Nov. 1997, vol. 82 (9): pp. 4197-4204.

Borgia et al., "A Method for Approximating Fractional Power Average Relaxation Times without Inversion of Multiexponential Relaxation Data," Magnetic Resonance Imaging, 1998, vol. 16(5/6): pp. 625-627.

Borgia et al., "Estimates of Permeability and Irreducible Water Saturation by Means of a New Robust Computation of Fractional Power Average Relaxation Times," Magnetic Resonance Imaging, 1998, vol. 16(5/6): pp. 613-615.

Fordham et al., "Imaging Multiexponentional Relaxation in the (y, loge T1) Plane, with Application to Clay Filtration in Rock cores," Journal of Magnetic Resonance Series A, 1995, vol. 113: pp. 139-150.

Freed, "Dependence on chain length of NMR relaxation time in mixtures of alkanes," The Journal of Chemical Physics, 2007, vol. 126: pp. 174502-1-174502-10.

Freed et al., "Scaling Laws for Diffusion Coefficients in Mixtures of Alkanes," Physical Review Letters, Feb. 2005, vol. 94: pp. 067602-1-067602-4.

Heaton et al., "4D NMR—Applications of the Radial Dimension in Magnetic Resonance Logging," Petrophysics, Apr. 21008, vol. 49(2): pp. 172-186.

Hürlimann et al., "Quantitative Measurement of Two-Dimensional Distribution Functions of Diffusion and Relaxation in Grossly Inhomogeneous Fields," Journal of Magnetic Resonance, 2002, vol. 157: pp. 31-42.

Kleinberg et al., "SPE 26470: Nuclear Magnetic Resonance of Rocks: T1 vs. T2," SPE International, 1993: pp. 553-563.

Kleinberg, "Well Logging," Encyclopedia of Nuclear Magnetic Resonance, vol. 8, eds. Grant et al., John Wiley & Sons: New York, 1996: pp. 4960-4969.

Kleinberg et al., "SPE 38737: Tapered Cutoffs for Magnetic Resonance Bound Water Volume," SPE International, 1997: pp. 1-6.

Press et al., "Chapter 18: Integral Equations and Inverse Theory," Numerical Recipes in C: The Art of Scientific Computing Second Edition, Cambridge University Press, 1992: pp. 788-819.

Prudnikov et al., "Chapter 2.1.: The Power of Algebraic Functions," Integrals and Series: vol. 5 Inverse Laplace Transforms, Gordon and Breach Science Publishers: Philadelphia, 1992: p. 11.

Song et al., "T1-T2 Correlation Spectra Obtained using a Fast Two-Dimensional Laplace Inversion," Journal of Magnetic Resonance, 2002, vol. 154: pp. 261-268.

Venkataramanan et al., "Solving Fredholm Integrals of the First Kind with Tensor Product Structure in 2 and 2.5 Dimensions," IEEE Transactions on Signal Processing, May 2002, vol. 50(5): pp. 1017-1026.

Venkataramanan et al., "Mellin transform of CPMG data," Journal of Magnetic Resonance, 2010, vol. 206: pp. 20-31.

* cited by examiner

ESTIMATION OF PETROPHYSICAL AND FLUID PROPERTIES USING INTEGRAL TRANSFORMS IN NUCLEAR MAGNETIC RESONANCE

CROSS-REFERENCE TO RELATED APPLICATION

This application claims benefit of U.S. Provisional Patent Application Ser. No. 61/530,234 filed Sep. 1, 2011, entitled, "ESTIMATION OF PETROPHYSICAL AND FLUID PROPERTIES USING INTEGRAL TRANSFORMS IN NUCLEAR MAGNETIC RESONANCE," which is incorporated by reference herein.

BACKGROUND

Rocks have a range of pore sizes. Hydrocarbons have a range of components. The pore-size distribution and component distribution give rise to distributions of relaxation times and diffusion coefficients observed with nuclear magnetic resonance (NMR). Estimation of these distributions from the measured magnetisation data plays a central role in the inference of in situ petro-physical and fluid properties. From the estimated distributions, linear functionals are computed to provide insight into rock or hydrocarbon properties. For example, moments of relaxation time or diffusion are often related to rock permeability and/or hydrocarbon viscosity. Specific areas underneath the relaxation time or diffusion distribution are used to estimate fluid saturations as well as bound and free fluid volumes.

In oilfield applications, the measured NMR magnetization data denoted by $G(t)$ is a multi-exponential decay, with time constant $T_2$ and amplitudes $f(T_2)$.

$$G(t) = \int_0^\infty P_\tau(T_2) e^{-t/T_2} f(T_2) dT_2. \quad (1)$$

The relaxation time $T_2$ is the characteristic time corresponding to loss of energy by protons in hydrocarbons or water present in pores of a rock or in the bulk fluid. The function $P_\tau(T_2)$ is referred to as polarization factor and depends on the pulse sequence. For example, $$P_\tau(T_2) = \begin{cases} 1 & CPMG \text{ pulse sequence with full polarization} \\ 1 - 2e^{-\tau/T_2} & \text{inversion recovery} - CPMG \text{ pulse sequence} \\ 1 - e^{-\tau/T_2} & \text{saturation recovery} - CPMG \text{ pulse sequence} \end{cases}$$

where $\tau$ is a function of pre-polarization time $T_w$ and longitudinal relaxation $T_1$. In downhole applications, the function $P_\tau(T_2)$ is a complex function of tool geometry (such as length of magnet and design of RF antenna), operational constraints (such as cable speed) as well as the pulse sequence.

In all applications, it is assumed that the data $G(t)$ are measured with additive, white, Gaussian noise. The measurement domain is the time domain. Answer products are calculated from the measured $G(t)$ as follows. Traditionally, assuming $P_\tau(T_2)$ is known, an inversion algorithm is used to estimate the distribution of relaxation times $f(T_2)$ in eqn. (1) from indications of the measured data $G(t)$. Next, linear functionals of the estimated $f(T_2)$ are used to estimate the petro-physical or fluid properties. For example, the area under the $T_2$ distribution is interpreted as the porosity of the rock. Often, based on lithology, a threshold $T_2$ is chosen as the cut-off characteristic time separating fluid bound to the pore surface and fluid that is not bound to the pore surface and can flow more easily. For example, in sandstones, the area under the $T_2$ distribution corresponding to relaxation times smaller than 33 msec has been empirically related to bound fluid volume. The remaining area under the $T_2$ distribution corresponds to free fluid volume. The mean of the distribution, $\langle \ln(T_2) \rangle$, is empirically related to either rock permeability and/or to hydrocarbon viscosity. The width of the distribution, $\sigma_{\ln(T_2)}$, provides a qualitative range of the distribution of pore sizes in the rock. Moments of relaxation time or diffusion are often related to rock permeability and/or hydrocarbon viscosity. Similar answer products can also be obtained from linear functionals computed from two-dimensional diffusion-relaxation data or $T_1$-$T_2$ relaxation data.

Estimation of $f(T_2)$ is an ill-conditioned and non-linear problem. Small changes in the measured data $G(t)$ due to noise can result in widely different $f(T_2)$. In theory, there are infinitely many $f(T_2)$ that fit the data. In the literature, this problem is addressed by choosing the "smoothest" solution $f(T_2)$ that fits the data. This smooth distribution is often estimated by minimization of a cost function Q with respect to the underlying $f$, $$Q = PG - Lf P^2 + \alpha Pf P^2, \quad (2)$$

where G is the measured data, L is the matrix of the discretized function $P_\tau(T_2) e^{-t/T_2}$ and $f$ is the discretized version of the underlying density function $f(T_2)$ in eqn. (1). The first term in the cost function is the least squares error between the data and the fit from the model in eqn. (1). The second term is referred to as regularization and incorporates smoothness in the relaxation amplitudes into the problem formulation. The parameter α denotes the compromise between the fit to the data and an a priori expectation of the distribution. The use of regularization and incorporation of smoothness into the problem formulation is subjective. In eqn. (2), it is possible to define alternate cost functions based on entropy, the Backus-Gilbert method or other measures of difference between data and fit.

SUMMARY

Embodiments relate to an apparatus and method of characterizing a subterranean formation including measuring an indication of a formation using nuclear magnetic resonance measurements, calculating an answer product by computing integral transforms on the indications in measurement-domain, and using answer products to estimate a property of the formation. The function used in the integral transform can be found analytically, numerically or by taking advantage of the convolution-multiplication equivalence or by using a method of successive approximations. Embodiments also relate to an apparatus and a method for characterizing a subterranean formation including collecting NMR data of a formation, calculating an answer product from the data, wherein the calculating comprises a formula $$K(x) \equiv \int_0^\infty k(t) e^{-t/x} dt.$$

and estimating a property of the formation using the answer product. Here, the variable x is a function of transverse relaxation time ($T_2$), longitudinal relaxation time ($T_1$), Diffusion (D), or various two-dimensional data sets (such as D-T$_2$ or D-T$_1$ or T$_1$-T$_2$), multi-dimensional data sets (such as D-T$_2$-T$_1$, D-T$_2$-T$_1$-different depth of investigations or D-T$_2$-T$_1$-azimuth) although embodiments are not limited thereto.

Also shown are the successive correction terms to the series approximation.

Figure 3:
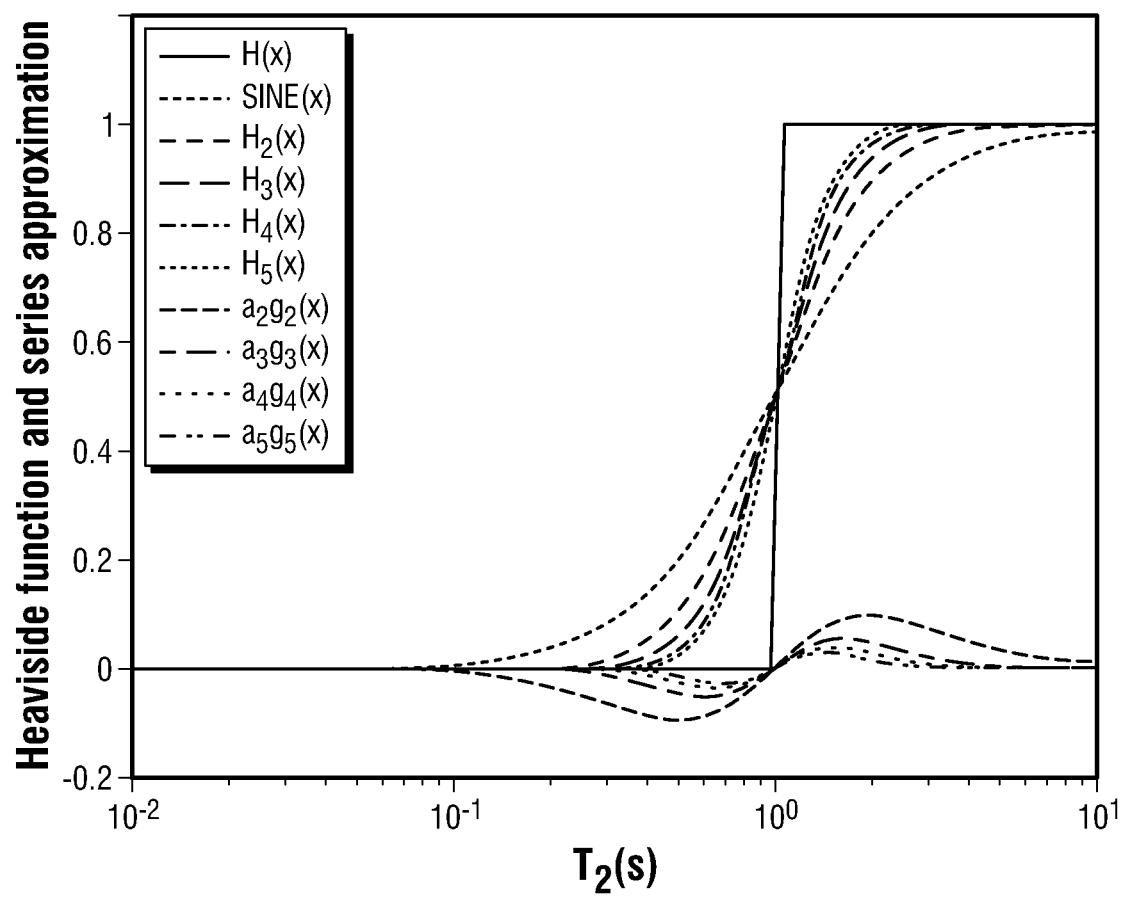
FIG. 3 is a series of plots of another embodiment including a successive series approximation to the—Heaviside function H(x), where $$x = \frac{1}{T_2}.$$
Figure 4:
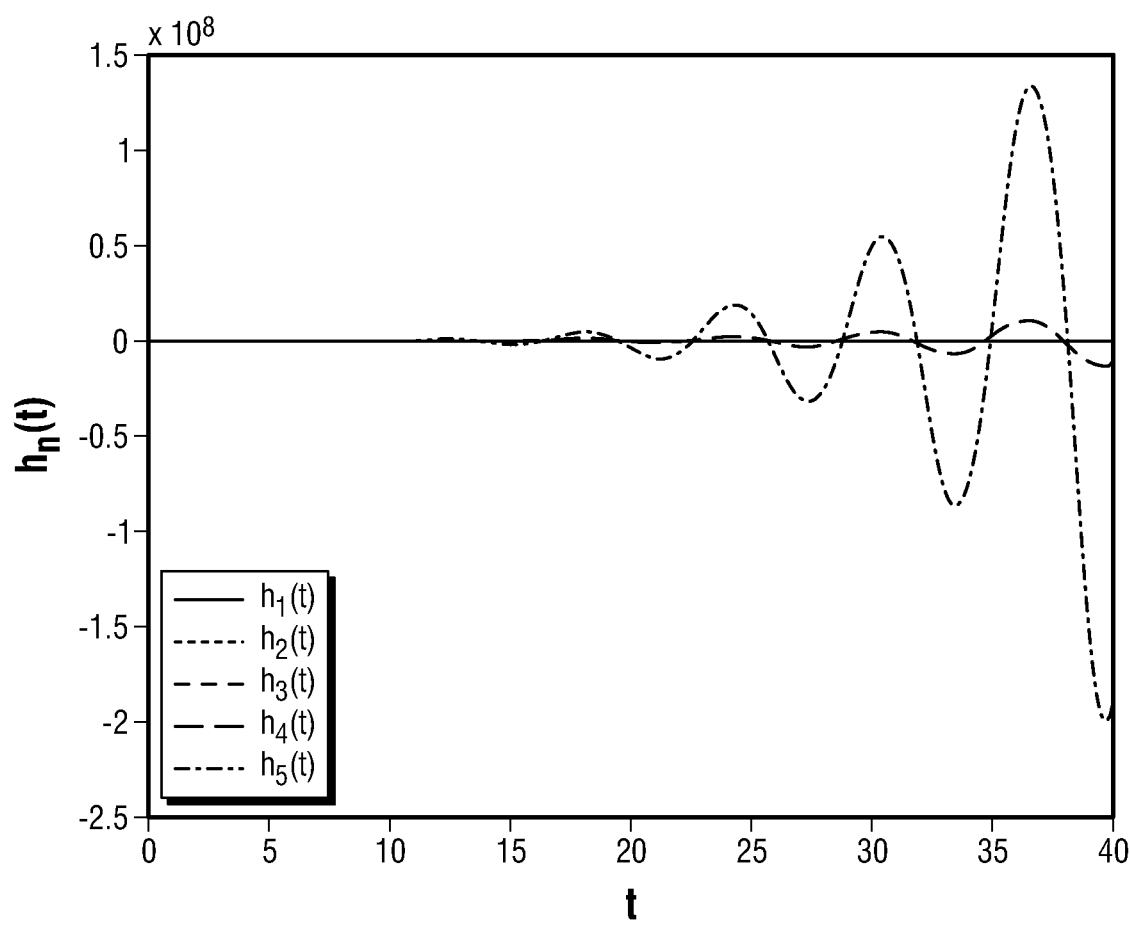

FIG. 4 provides functions h$_n$(t) such that $$\int_0^\infty h_n(t)G(t)dt,$$

n=1, . . . , 5 provides tapered areas indicated by H$_n$(X) in FIG. 3.

Figure 5:
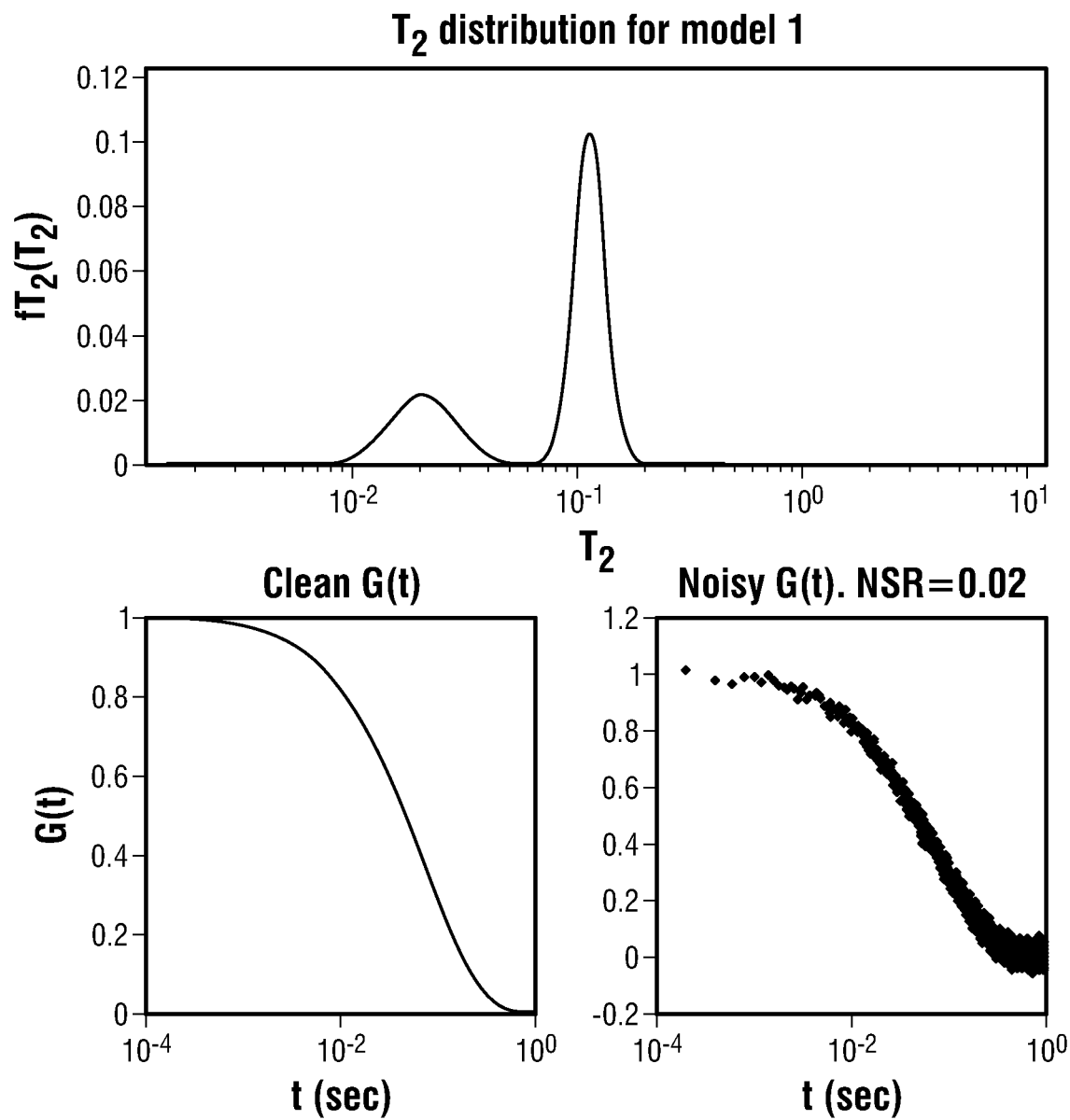

FIG. 5 provides a series of graphs, providing a model of simulated T$_2$ distributions and noise-free echoes and noisy data used in benchmarking processing of an embodiment on simulated data.

Figure 6:
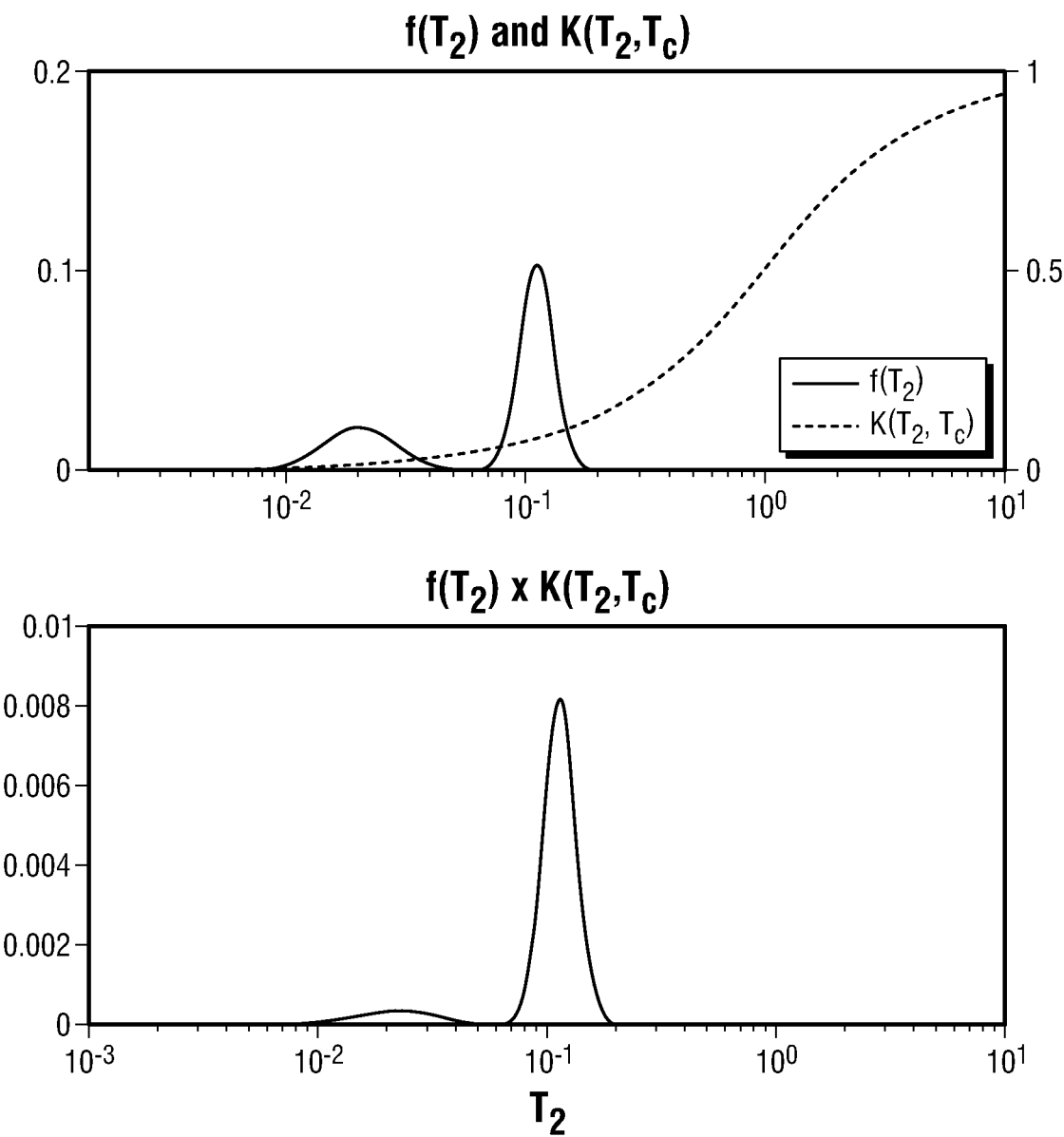

FIG. 6 provides a first graph of an example T$_2$ distribution and desired function K(T$_2$,T$_c$). The second graph shows the resulting product. The area under the curve in the bottom plot is directly computed in the measurement domain by application of one of the embodiments of the invention discussed herein.

Figure 7:
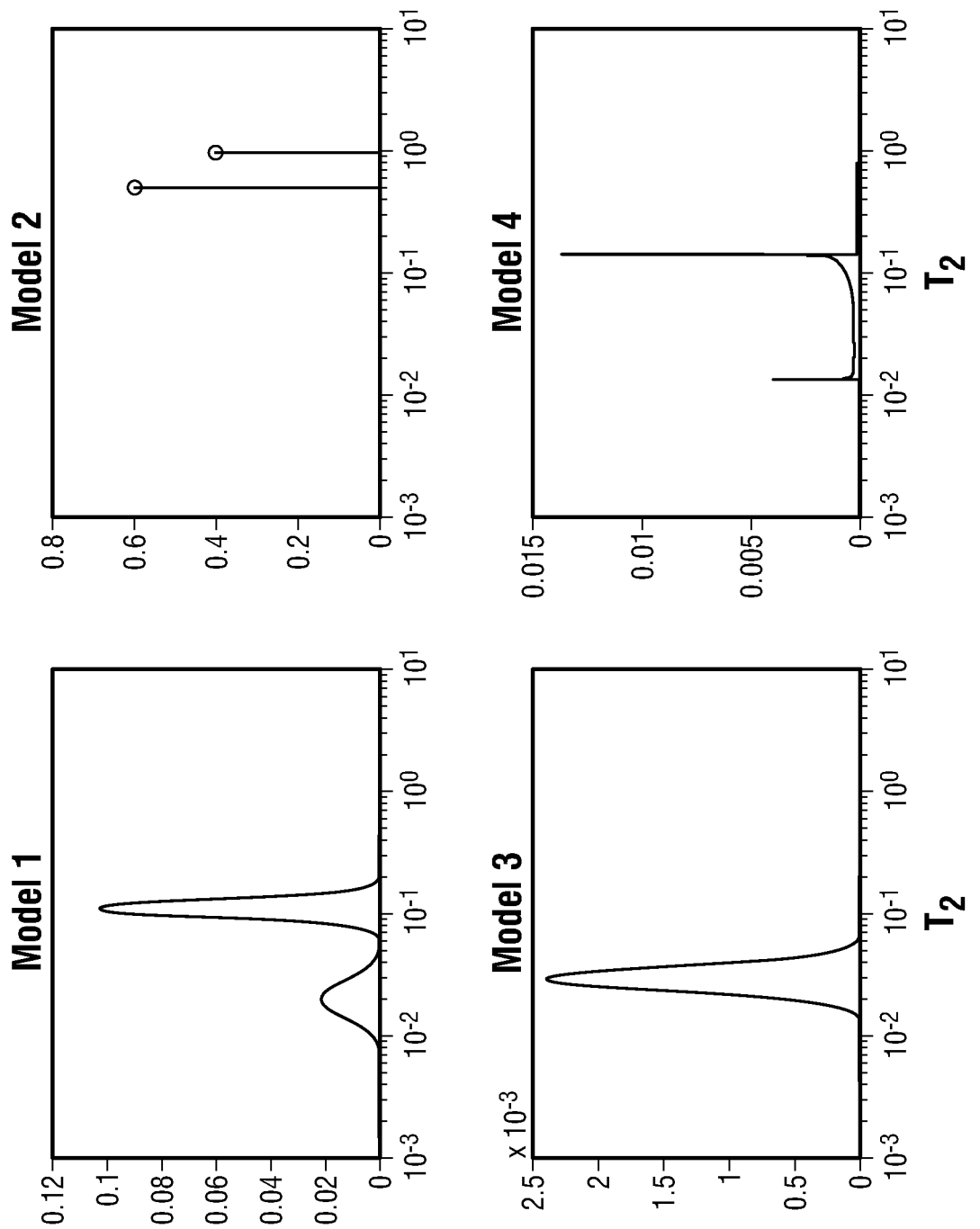

FIG. 7 provides a set of graphs, providing several models of simulated T$_2$ distributions and noise-free echoes used in benchmarking this embodiment.

DETAILED DESCRIPTION

Embodiments are provided for estimating answer products by computing linear functionals of the distribution computed from the measurement indications by integral transforms in the measurement domain. This method does not involve first computing the distribution function of relaxation times and/or diffusion. In the examples shown below, the measurement domain is the time domain. Different linear functionals of the distribution function can be obtained by choosing appropriate functions in the integral transforms. Moments and tapered and sharp areas are some of the linear functionals that are obtained using this approach. Where the sample is a rock or a formation, the answer products may include parameters such as rock permeability and/or hydrocarbon viscosity, bound and free fluid volumes, etc. The parameters may then be used, if desired, in models, equations, or otherwise to act on the sample, such as in recovering hydrocarbons from the formation. Examples of NMR-related distributions include transverse relaxation time (T$_2$) distributions, longitudinal relaxation time (T$_1$) distributions, diffusion (D) distributions, and various two-dimensional distributions, although embodiments are not limited thereto. This method can be applied to data obtained from a variety of pulse sequences including CPMG, inversion and saturation recovery and diffusion editing, as well as pulse sequences often deployed downhole such as enhanced precision mode (EPM). Generally, the measurements are data that are either fully or partially polarized and the measurements are from cores in the lab, downhole logs, flowline measurements, surface measurements or a combination thereof.

In this section, we discuss the application of integral transforms to estimate linear functionals of $f(T_2)$ directly from the indications of the measured data G(t). Historically, we have shown that when the data are fully polarized with $P_\tau(T_2)=1 \forall \tau$, T$_2$, the Mellin transform of the data and its time-derivatives can be used to provide moments of T$_2$. An article, MELLIN TRANSFORM OF CPMG DATA, Journal of Magnetic Resonance 206 (2010) 20-31, which is incorporated by reference herein in its entirety, provides the application of Mellin transform to NMR data to help this process. We extend this further and provide integral transforms that can be used to provide tapered and sharp areas of NMR data. Further, we use integral transforms to analyse data with various polarization factors P$_\tau$(T$_2$), obtained from different pulse sequences including CPMG, inversion and saturation recovery and diffusion editing as well as pulse sequences often deployed down-hole such as enhanced precision mode (EPM).

The integral transform of the data G(t) is denoted by $\Im\{G(t)\}=A$, and defined by $$\Im\{G(t)\} = A = \int_0^\infty k(t)G(t)dt \qquad (3)$$

From eqns. (1) and (3), $$A = \int_0^\infty k(t)G(t)dt = \int_0^\infty K(T_2)P_\tau(T_2)f(T_2)dT_2 \qquad (4)$$

where the functions k(t) and K(T$_2$) form a Laplace-transform pair, with $$K(T_2) \equiv \int_0^\infty k(t)e^{-t/T_2}dt. \qquad (5)$$

Thus, from the right-hand-side (RHS) of eqn. (4), for a desired linear transformation in the T$_2$ domain, our objective is to construct a function k(t) in the time-domain, so that the scalar product of the function with the measured data allows computation of A, the parameter of interest.

Figure 1:
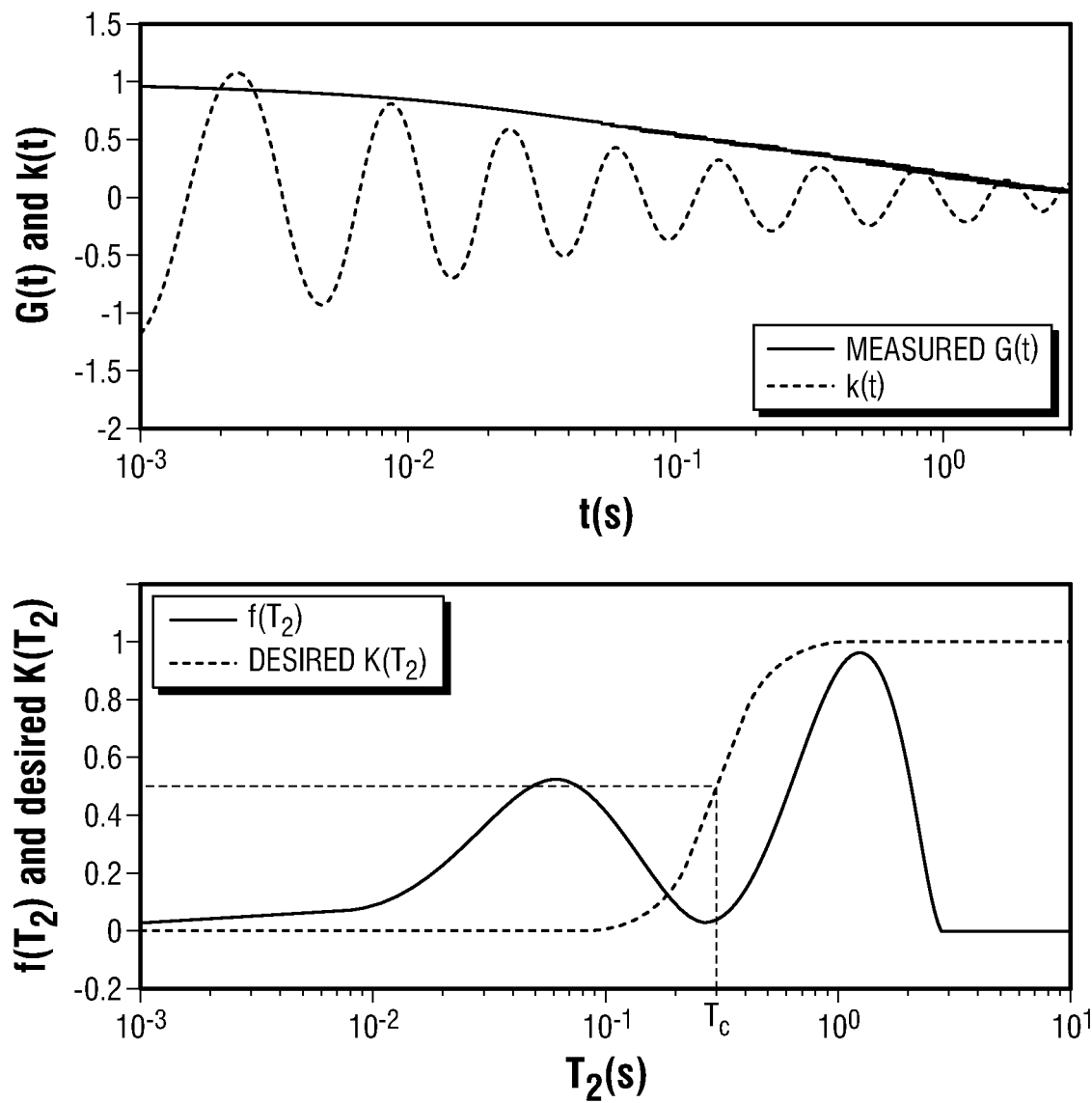
FIG. 1 provides a first graph of a measured data and a second graph of the underlying T$_2$ distribution. In this embodiment, the tapered area indicated in the second graph can be computed by the integral transform of the measured data with function indicated in the first graph.

This is illustrated in FIG. 1 with an example. The solid traces show the measured CPMG data G(t) and its corresponding and unknown distribution $f(T_2)$. The dotted trace in FIG. 1(B) indicates the tapered transition $K(T_2)$ for computing the desired tapered area of the $T_2$ distribution. The function k(t) corresponding to this tapered function $K(T_2)$ is shown in FIG. 1(A). This function k(t) can be found using multiple methods: (1) using either an analytical form for k(t)(examples of this is shown in Table 1), (2) using an numerical approach, (3) using a method of successive approximations, and/or (4) using convolution analysis. All these methods are described below. Once k(t) is estimated, a scalar product of k(t) with G(t) directly provides the tapered area A. Since this approach does not involve solving for $f(T_2)$ and then estimating $$\int_0^\infty K(T_2) f(T_2) dT_2,$$

it is more straight-forward and not susceptible to the subjectivity of traditional algorithms that involve inversion of an ill-conditioned and non-linear problem.

As we discuss below, given a desired $K(T_2)$, the function k(t) can be computed in four ways: often, it can be computed analytically or numerically. It can also be computed using the method of successive approximations to $K(T_2)$. An alternate method of computing it involves taking advantage of the convolution-multiplication equivalence between the time and T2 domain. We will illustrate all four methods below, through multiple examples.

For a desired $K(T_2)$, when the function k(t) exists analytically or can be computed numerically, the parameter A is obtained from eqn. (3). However, the function k(t) may not exist $\forall K(T_2)$. When it exists, it may also have infinite energy which can be related to infinite uncertainty in the estimated parameter A leading to instability in computing the parameter. Thus, the integral transform approach can provide insight into what linear functionals of the $T_2$ distribution can be directly applied to the data G(t) and are stable in the context of providing low uncertainty in A.

The uncertainty in A can be quantified as a function of the signal-to-noise ratio (SNR) in the measured data. Let $\sigma_\varepsilon$ denote the standard deviation of the additive white Gaussian noise in the data. Eqn. (4) can be computed in the discrete-time domain as $$A = t_E \sum_{n=0}^{N} k(n t_E) G(n t_E) \quad (6)$$

where $t_E$ denotes the sampling time or echo spacing. Therefore, $$\sigma_A^2 = \sigma_\varepsilon^2 t_E \left[ \sum_{n=0}^{N} k^2(n t_E) t_E \right]. \quad (7)$$

Eqn. (7) shows that when the function k(t) is square integrable, i.e, k(t) has finite energy E, where $$E = \int_0^\infty k^2(t) dt,$$

then the uncertainty in A is always finite and directly related to the uncertainty in the measurement.

In the sub-sections below, we describe tables of integral transforms developed for different polarization factors $P_\tau(T_2)$ encountered in oilfield NMR applications.

A. Tapered Areas from Fully Polarized Data

Consider NMR data that have been fully polarized, with $P_\tau(T_2)=1 \forall T_2$. In this sub-section, we describe a few integral transforms where $K(T_2)$ corresponds to tapered and sharp Heaviside functions.

As shown in FIG. 1, let $T_c$ denote the $T_2$ relaxation time at which the desired cut-off of the tapered Heaviside function is 0.5. The parameter $T_c$ is user-specified and may come from laboratory study of rock and fluid properties or may correspond to a value of $T_2$ expected to separate two fluids in the $T_2$ domain. For example, in sandstones and carbonates, the area under the $T_2$ distribution corresponding to relaxation times smaller than 33 and 100 msec, respectively, has been empirically related to bound fluid volume. Thus, given a value of $T_c$, we seek a tapered or sharp Heaviside function $K(T_2, T_c)$, such that the tapered area can be computed in the time-domain using the corresponding function $k(t, T_c)$. The integral transform for computing tapered and sharp transitions should satisfy the following properties:
1. The function $k(t, T_c)$ should exist $\forall$ t and $K(T_2, T_c)$ should exist $\forall T_2$. 2. Based on the underlying petrophysics, it is desirable that $K(T_2, T_c)$ be monotonic between 0 and 1 (on the y-axis), with $$K(T_2, T_c)|_{T_2=0} = 0 \quad (8)$$

$$\lim_{T_2 \to \infty} K(T_2, T_c) = 1 \quad (9)$$

$$K(T_2, T_c)|_{T_2=T_C} = 0.5. \quad (10)$$

3. It should be possible to adjust the slope m in the $\log(T_2)$ space of the transition region, with $$m \equiv \frac{dK(T_2 T_c)}{d \log T_2} \bigg|_{T_2=T_c}. \quad (11)$$

In most oilfield applications, the desired slope varies from m=0.4 for gradual tapered cut-offs [14] to m=4 for sharp cut-offs.

Using analytical means (method 1), we have developed a set of integral transforms that satisfy these properties, they are summarized in Table 1. For ease of reference, we have suggested names for the transforms based on the function k(t). The energy for some of the transforms is infinity, implying infinite uncertainty in the estimated area. This energy can be decreased by several methods. One such method involves multiplication of the function k(t) by an exponential decaying signal in the time domain. A second method involves restricting the integral transform to a finite time-period. Both methods decrease the energy considerably while also reducing the slope in the transition region. For e.g., as shown in Table 1, the Haar transform (HT) (row 3) has infinite energy. On the other hand, the energy of an exponential Haar transform (EHT) (row 5) is finite.

From eqn. (7), a desired uncertainty in the estimated area $\sigma_A$ can be translated to a desired and finite energy in the function. This finite energy can be achieved by suitable choice of parameters of the transform satisfying both the energy criteria as well as properties 1-3 described above. For e.g., when the desired energy for the EHT is $$\frac{2}{\pi T_c},$$

then the parameters C, α and β take values provided in the following table.

TABLE 1

Integral transforms that give rise to tapered transitions in the log($T_2$) domain
B. Transforms on imperfectly polarized data

| $K(T_2, T_c)$ | Parameters | $k(t, T_c)$ | E | m | Name of Transform |
|---|---|---|---|---|---|
| $\frac{2}{\pi}\tan^{-1}(\alpha T_2)$ | $\alpha = \frac{1}{T_c}$ | $\frac{2}{\pi}\frac{\sin(\alpha t)}{t}$ | $\frac{2}{\pi T_c}$ | 0.32 | Sinc |
| $\frac{T_2}{\alpha}\tanh\left(\frac{\alpha}{T_2}\right)$ | $\alpha = \frac{T_c}{0.52219}$ | $\frac{1}{\alpha}(-1)^n$ $2n\alpha < t < 2(n+1)o$ | ∞ | 0.42 | Haar |
| $\frac{\alpha^2}{\alpha^2 + \frac{1}{T_2^2}}$ | $\alpha = \frac{1}{T_c}$ | $\alpha \sin(\alpha t)$ | ∞ | 0.5 | Sine |
| $\frac{C}{\left(\frac{1}{T_2}+\beta\right)}\tanh\left[\alpha\left(\frac{1}{T_2}+\beta\right)\right]$ | $C = \frac{0.7213}{T_c}$ $\alpha = (1.572)T_c$ $\beta = \frac{0.4087}{T_c}$ | $C(-1)^n e^{-\beta t}$ $2n\alpha < t < 2(n+1)o$ | $\frac{2}{\pi T_c}$ | 0.35 | Exponential Haar |
| $\frac{\alpha^2 + \beta^2}{\alpha^2 + \left(\beta+\frac{1}{T_2}\right)^2}$ | $\alpha = \sqrt{4E\beta - \beta^2}$ $\beta = \frac{1}{T_c^2\left(4E - \frac{2}{T_c}\right)}$ | $\frac{\alpha^2+\beta^2}{\alpha}e^{-\beta t}\sin(\alpha t)$ | $\frac{2}{\pi T_c}$ | 0.3 | Exponential Sine |
| $g_0 + \sum_{n=1}^{\infty} a_n g_n(x), x = \frac{T_c}{T_2}$ $g_n(x) = \frac{x^{2n-2} - x^{2n}}{(1+x^2)^{2n-1}}$ | $a_k$ computed recursively | See Appendix A | ∞ | $0.5 \leq m_n \leq o$ Variable Slope | Series Expansion |

Consider imperfectly polarized data with $$P_\tau(T_2) = 1 - e^{-\tau/T_2} \tag{12}$$

where $$\tau = T_w/r, \, r = \left(\frac{T_1}{T_2}\right)$$

and $T_w$ is the wait time. This polarization factor plays an important role in saturation-recovery-CPMG pulse sequence and in enhanced precision mode (EPM) used in downhole applications. We show below that the integral transform approach that was developed on fully polarized data with $P_\tau(T_2)=1 \, \forall T_2$ can be applied to imperfectly polarized data as well. From eqns. (1) and (12)

$$G(t) = \int_0^\infty e^{-t/T_2} f(T_2) dT_2 - \int_0^\infty e^{-(t+\tau)/T_2} f(T_2) dT_2 \tag{13}$$

Let the fully polarized data be denoted by M(t), where $$M(t) = \int_0^\infty e^{-t/T_2} f(T_2) dT_2. \tag{14}$$

Equation (13) can then be cast as follows $$G(t) = M(t) - M(t+\tau) \tag{15}$$

For a finite time t we have $$\lim_{N \to \infty} M(t + N\tau) = 0. \tag{16}$$

Therefore $$\sum_{n=0}^{N-1} G(t + n\tau) = M(t) - M(t + N\tau) \tag{17}$$

For a finite time t and in the limit N→∞, we get $$M(t) = \sum_{n=0}^{\infty} G(t + n\tau). \tag{18}$$

Therefore, if τ is either known or estimated, the fully polarized data M(t) can be reconstructed using eqn. (18) from the measured data G(t). Integral transforms can be applied to M(t) to directly estimate linear functionals of $f(T_2)$.

Effect of Noise

In practice we have a limited number of noisy samples of the form $$\tilde{G}(it_E) = G(it_E + n(it_E)), \quad i=1, \ldots, N. \quad (19)$$

Using eqn. (18) will result on a modified noise $$n_s(it_E) = \sum_{j=0}^{N} n(it_E + j\tau) \quad (20)$$

with variance $$\sigma_M^2 = N\sigma_\varepsilon^2. \quad (21)$$

For noisy data, it may be desirable to perform a denoising procedure before applying eqn. (18).

C. Transforms on Data from Logging Tools

The function k(t) can also be found using a combination of numerical and analytical methods as follows. This method is illustrated with an example in logging tools where the polarization factor $P_\tau(T_2)$ tends to be more complex and depends on a number of parameters including hardware design such as length of permanent magnet, cable speed, etc. For simplicity, we have ignored the subscript $\tau$ in the polarization term in this sub-section. In logging applications, we have found that over a range of factors, $P(T_2)$ is well represented by $$P(T_2); \frac{1}{\sum_{k=0}^{\infty} a_k e^{-bk/T_2}} \quad (22)$$

Figure 2:
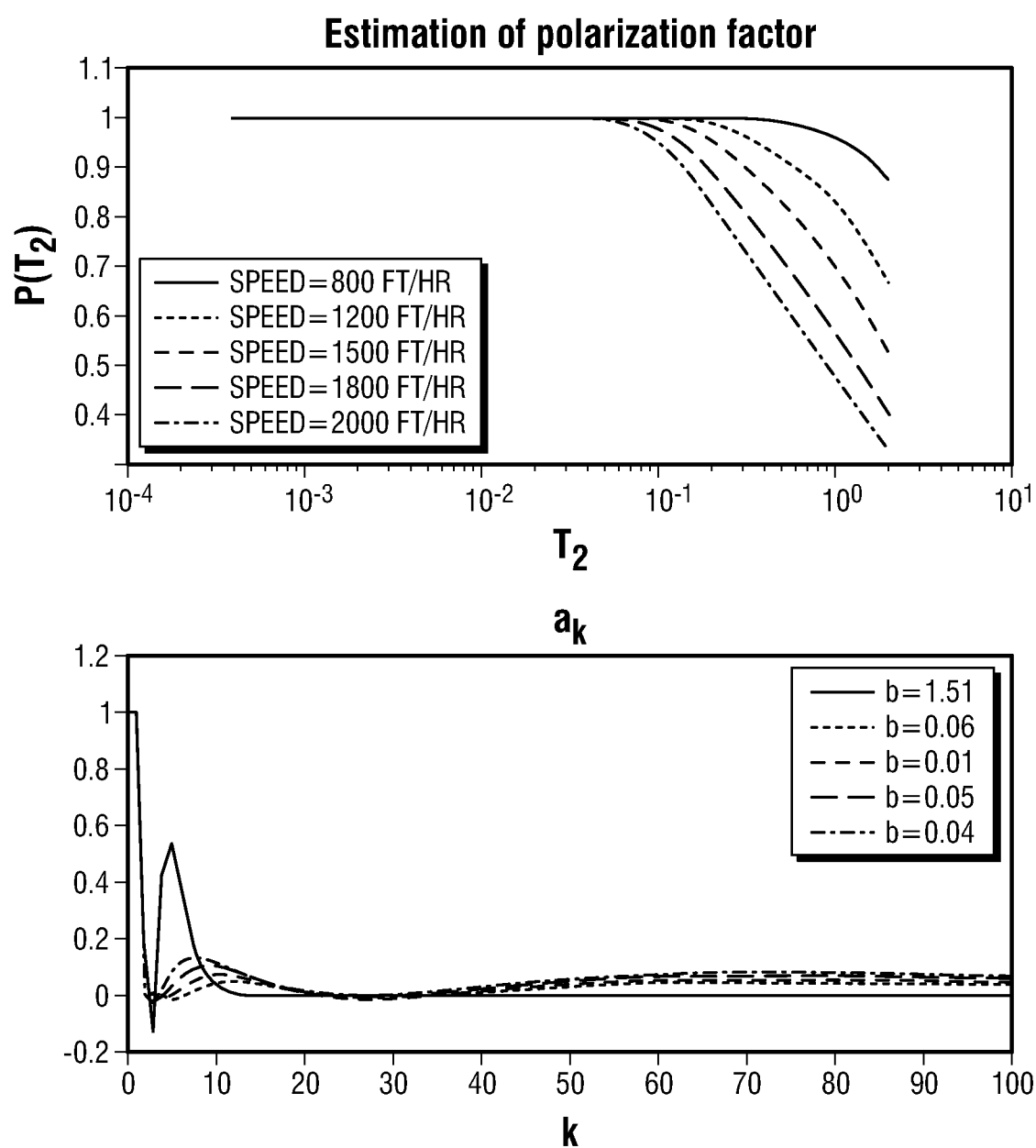
FIG. 2 provides a first graph of pre-polarization factor for a logging tool at different cable speeds. The polarization factor in logging tools is a complex function of tool geometry, operational constraints such as logging speed and pulse sequence. In a number of circumstances, such as shown in this example, at logging speeds varying from 800-2000 ft/hour, the fit (solid line) from eqn. (22) fits the polarization factor (in dots) very well. The second graph shows the coefficients obtained from the fit.

Eqn. (22) is a good fitting function for a wide range of parameters. For example, the imperfectly polarized data in the last sub-section is obtained from eqn. (22) with b=τ and $a_k=1 \forall k$. Similarly, at a range of cable speeds, the fit from eqn. (22) matches $P(T_2$ reasonably well and is shown in FIG. 2. The polarization factor in logging tools is a complex function of tool geometry, operational constraints such as logging speed and pulse sequence. In a number of circumstances, such as shown in this example, at logging speeds varying from 800-2000 ft/hour, the fit (solid line) from eqn. (22) fits the polarization factor (in dots) very well. The bottom plot shows the coefficients $a_k$ obtained from the fit.

Along the lines of our results presented above, the fully polarized data M(t) can be reconstructed from G(t). From eqns. (14) and (22), we get $$M(t) = \int_0^\infty e^{-t/T_2} f(T_2) \frac{P(T_2)}{P(T_2)} dT_2 \quad (23)$$

$$= \int_0^\infty e^{-t/T_2} f(T_2) P(T_2) \left[\sum_k a_k e^{-bk/T_2}\right] dT_2$$

$$= \sum_k a_k \int_0^\infty e^{-(t+bk)/T_2} P(T_2) f(T_2) dT_2$$

$$= \sum_k a_k G(t + bk).$$

Integral transforms can be applied to M(t) to directly estimate linear functionals of $f(T_2)$.

Method 2:

The function k(t) can also be found numerically as follows. For example, it is possible that either $P_\tau(T_2)$ or $K(T_2)$ is not well approximated by a closed form expression or an analytical k(t) does not exist for a specified $K(T_2)$. In this case, k(t) can be computed numerically as follows. For example, consider the case where the data are fully polarized with $P_\tau(T_2)=1 \forall T_2$. The desired $K(T_2,T_c)$ is shown in the dotted trace in FIG. 1(B). A numerical least squares approximation to $k(t,T_c)$ can be obtained using singular value decomposition (SVD), with $$\tilde{k}(t) \approx V_n \Sigma_n^{-1} U_n^T K(T_2). \quad (24)$$

Here matrices U, Σ and V are obtained by SVD of function $e^{-t/T_2}$ and n refers to the number of significant singular values. FIG. 1(A) shows the $\tilde{k}(t)$ obtained using eqn. (24).

In another embodiment of the method, the function k(t) can be found such that its Laplace transform minimizes the error with respect to the desired $K(T_2,T_c)$ and has a minimal energy, $$\min_{k(t)} \left\| \int_0^\infty k(t)e^{-t/T_2} dt - K(T_2, T_c) \right\|^2$$

$$\text{s.t.} \quad \|k\|^2 < E.$$

Method 3:

The function k(t) can also be found using the equivalence of the convolution-multiplication operation between the time and $T_2$ domain. This is further described below. We show that the product of two functions in the $T_2$ domain corresponds to convolution in the time-domain. This property implies that the integral transforms described in this memo can also be combined in the time domain to estimate other parameters. For example, the moments of a specified region of the $T_2$ distribution can be computed by using a function computed as the convolution of the Mellin operator and the Exponential Haar transform. Consider two different integral transforms of the measured data, where function k(t) in eqn. (3) is represented by $k_1(t)$ and $k_2(t)$ respectively, $$A_1 = \int_0^\infty k_1(t)G(t)dt = \int_0^\infty K_1(T_2)P_\tau(T_2)f(T_2)dT_2 \quad (25)$$

$$A_2 = \int_0^\infty k_2(t)G(t)dt = \int_0^\infty K_2(T_2)P_\tau(T_2)f(T_2)dT_2. \quad (26)$$

Here, the functions $K_1(T_2)$ and $K_2(T_2)$ correspond to different linear functionals. Our interest is in evaluation of $A_3$, where $$A_3 = \int_0^\infty K_3(T_2)P_\tau(T_2)f(T_2)dT_2, \quad (27)$$

and $$K_3(T_2) \equiv K_1(T_2)K_2(T_2) \quad (28)$$

$$= \int_0^\infty k_1(\tau)e^{\frac{-\tau}{T_2}} d\tau \int_0^\infty k_2(t_2)e^{\frac{-t_2}{T_2}} dt_2 \quad (29)$$

From eqn. (5)

$$\int_0^\infty k_3(t)e^{-t/T_2} dt = \int_0^\infty \int_0^\infty k_1(\tau)k_2(t_2)e^{\frac{-(\tau+t_2)}{T_2}} d\tau dt_2 \quad (30)$$

-continued

Let $\tau + t_2 = t$. Thus $$\int_0^\infty k_3(t)e^{-t/T_2}dt = \int_0^\infty \left[\int_0^\tau k_1(\tau)k_2(t-\tau)d\tau\right]e^{-t/T_2}dt \quad (31)$$

Thus, the parameter $A_3$ can be computed as, $$A_3 = \int_0^\infty k_3(t)G(t)dt \quad (32)$$

where $k_3(t)$ is obtained as a convolution of kW and $k_2(t)$, $$k_3(t) = \int_0^\tau k_1(\tau)k_2(t-\tau)d\tau. \quad (33)$$

Hence, the product of two functions in the $T_2$ domain corresponds to convolution in the time-domain. This property implies that the integral transforms described in this manuscript can also be combined to estimate other parameters. For example, this property implies that the moments of a specified region of the $T_2$ distribution can be computed by integral transforms of the measured data, using a function obtained as a convolution of the Mellin operator and the Exponential Haar transform.

Method 4:

We describe below a method for computing k(t) using method of successive approximations. We illustrate this with an example. Consider $K(T_2)$ is an arbitrarily sharp transition in the $T_2$ domain. Let $$x = \frac{T_c}{T_2}.$$

Let the Heaviside function H(x) be defined as follows.

$$H(x) = 1 \text{ for } x < 1 \quad (34)$$
$$= 0.5 \text{ for } x = 1 \quad (35)$$
$$= 0 \text{ otherwise.} \quad (36)$$

In this method, we define $g_0(x)$ to be a generating function if it is monotonic and takes values between 0 and 1 and satisfies the following property, $$g_0(x) + g_0\left(\frac{1}{x}\right) = 1. \quad (37)$$

Examples of generating functions that resemble a Heaviside function and satisfy the above property are $$g_0(x) = \frac{2}{\pi}atan\left(\frac{1}{x}\right) \text{ and}$$

$$g_0(x) = \frac{1}{1+x^2}$$

We seek a series of coefficients $a_n$ and functions $g_n(x)$, n=1, ..., ∞ such that $$H(x) = g_0(x) + \sum_{n=1}^\infty a_n g_n(x) \quad (38)$$

For n≥1, we seek functions $g_n(x)$ such that the functions satisfy the following properties:

1. $g_n(x)$ should have unique inverse Laplace transform in closed-form and should exist for all x.
2. $g_n(X)$ should be anti-symmetric in log–x, with $$g_n(x) = -g_n\left(\frac{1}{x}\right). \quad (39)$$

3. When x is small, $g_n(x)$: $x^n$.
4. When x is large, $g_n(x)$: $x^{-n}$.

Properties (1), (3) and (4) are self-explanatory. Property (2) follows from the Heaviside function H(x) and generating function $g_0(x)$ satisfying eq. (37). At the first iteration, the approximate Heaviside function is $$H_1(x) = g_0(x) + a_1 g_1(x) \quad (40)$$

Therefore, $$H_1\left(\frac{1}{x}\right) = g_0\left(\frac{1}{x}\right) + a_1 g_1\left(\frac{1}{x}\right) \quad (41)$$

From our construction, $H_1(x)$ and $g_0(x)$ satisfy eq. (37). Therefore, $$1 - H_1(x) = 1 - g_0(x) + a_1 g_1\left(\frac{1}{x}\right) \quad (42)$$

Thus, from eqns. (40) and (42), we have $$g_1(x) = -g_1\left(\frac{1}{x}\right).$$

A similar proof follows for any $g_n(x)$, n≥1.

Case 1:

Let $$g_0(x) = \frac{2}{\pi}atan\left(\frac{1}{x}\right).$$

Its Taylor-series expansion is $$\frac{2}{\pi}atan\left(\frac{1}{x}\right) = H(x) - \frac{2}{\pi}\left[x - \frac{x^3}{3} + \frac{x^5}{5} \ldots\right] \text{ for } |x| < 1. \quad (43)$$

If we subtract from $g_0(x)$ the terms in the Taylor-series proportional to $x^n$(n≥1), written as a function of $g_n(x)$, then, we will obtain a function that converges to 1 for $|x|<1$ and converges to 0 for $|x|>1$. Since the Taylor-series expansion has only odd-powers of x, we consider $$g_n(x) = \frac{-x^{2n-1} + x^{2n+1}}{(1+x^2)^{2n}} \quad (44)$$

These functions satisfy properties (1)-(4). In addition, $$\sum_{k=1}^{\infty} a_k g_k(x) = \sum_{k=1}^{\infty} a_k \frac{-x^{2k-1} + x^{2k+1}}{(1+x^2)^{2k}} \quad (45)$$

Using the series expansion for $$\frac{1}{(1+x^2)^{2k}}$$

around x=0, we get $$\sum_{k=1}^{\infty} a_k g_k(x) = \sum_{k=1}^{\infty} a_k (x^{2k+1} - x^{2k-1}) \left[ \sum_{m=0}^{\infty} (-1)^m \binom{2k+m-1}{m} x^{2m} \right] \quad (46)$$

Matching the coefficients for $x^{2n-1}$ in eqns. (43) and (46) yields $$a_n = \frac{(-1)^{n-1}}{2n-1} + \sum_{k=1}^{n-1} (-1)^{n-k} a_k \left[ \binom{n+k-2}{n-k-1} + \binom{n+k-1}{n-k} \right]. \quad (47)$$

The first three coefficients are $$a_1 = \frac{2}{\pi},$$
$$a_2 = \frac{8}{3} a_1 \text{ and}$$
$$a_3 = \frac{128}{15} a_1.$$

Let $$\tau = \frac{t}{T_c}.$$

The inverse Laplace transforms of the first three terms in the series expansion are $$L^{-1}\left[\frac{x - x^3}{(1+x^2)^2}\right] = \frac{1}{T_c} [\tau \sin(\tau) - \cos(\tau)]$$

$$L^{-1}\left[\frac{x^3 - x^5}{(1+x^2)^4}\right] = \frac{1}{T_c} \left[\frac{1}{24}(-6\tau^2 \cos(\tau) - 6\tau \sin(\tau) + \tau^3 \sin(\tau))\right]$$

$$L^{-1}\left[\frac{x^5 - x^7}{(1+x^2)^6}\right] = \frac{1}{T_c} \left[\frac{1}{1920}\binom{30\tau^2 \cos(\tau) - 15\tau^4 \cos(\tau) - 30\tau \sin(\tau) -}{55\tau^3 \sin(\tau) + \tau^5 \sin(\tau)}\right].$$

A general expression for the inverse Laplace transform for $g_n(x)$ can be obtained from the following:

$$L^{-1}\left[\frac{x^r - x^{r+2}}{(1+x^2)^{r+1}}\right] = \quad (48)$$

$$\frac{\tau^{r-1}}{T_c \Gamma(r) \Gamma(r+2)} \left[ \begin{array}{l} \tau^2 \Gamma(r)_1 F_2\left(r+1; \frac{r}{2}+1, \frac{r}{2}+\frac{3}{2}; -\frac{\tau^2}{4}\right) - \\ \Gamma(r+2)_1 F_2\left(r+1; \frac{r}{2}+\frac{1}{2}, \frac{r}{2}; -\frac{\tau^2}{4}\right) \end{array} \right]$$

where $_1F_2$ refers to the generalized hypergeometric function.

Case 2:
Let $$g_0(x) = \frac{1}{1+x^2}.$$

Its Taylor-series expansion (around x=0) is $$\frac{1}{1+x^2} = H(x) - x^2 + x^4 - x^6 + \ldots \quad (49)$$

Since the series expansion has only even powers of x, we consider $g_n(x)$ of the form, $$g_n(x) = \frac{x^{2n-2} - x^{2n}}{(1+x^2)^{2n-1}}, \quad (50)$$

$$n = 1, 2, \ldots$$

These functions satisfy properties (1)-(4). Using series expansion of $$\frac{1}{(1+x^2)^{2n-1}}$$

around x=0, we get, $$\sum_{k=1}^{\infty} a_k g_k(x) = \sum_{k=1}^{\infty} a_k \frac{-x^{2k-2} + x^{2k}}{(1+x^2)^{2k-1}} \quad (51)$$

$$= \sum_{k=1}^{\infty} a_k (x^{2k-2} - x^{2k}) \left[ \sum_{m=0}^{\infty} (-1)^m \binom{2k+m-2}{m} x^{2m} \right] \quad (52)$$

Matching the coefficients for $x^{2n-2}$ in eqns. (49) and (52) yields $$a_n = (-1)^{n-1} - \sum_{k=1}^{n-1} (-1)^{n-k} a_k \left[ \binom{n+k-2}{n-k} + \binom{n+k-3}{n-k-1} \right]. \quad (53)$$

The first three coefficients are $a_1=0$, $a_2=-1$ and $a_3=-3$. Let $$\tau = \frac{t}{T_c}.$$

The inverse Laplace transforms of the first three terms in the series expansion are $$L^{-1}\left[\frac{1-x^2}{(1+x^2)}\right] = \frac{1}{T_c}[2\sin(\tau) - \delta(\tau)]$$

$$L^{-1}\left[\frac{x^2-x^4}{(1+x^2)^3}\right] = \frac{1}{T_c}\left[\frac{1}{4}(\tau^2\sin(\tau) - \sin(\tau) - 3\tau\cos(\tau))\right]$$

$$L^{-1}\left[\frac{x^4-x^6}{(1+x^2)^5}\right] =$$
$$\frac{1}{T_c}\left[\frac{1}{192}(\tau^4\sin(\tau) - 10\tau^3\cos(\tau) - 21\tau^2\sin(t) - 3\sin(\tau) + 3\tau\cos(\tau))\right].$$

The function $g_0(x)$ for the second case as well as successive series approximation to $H(x)$ are shown in FIG. 3. The corresponding signals in the time domain, $h_n(t)$, which directly provide the tapered areas is shown in FIG. 4. Thus, in this example, we show that Taylor-series expansion of the generating function in terms of anti-symmetric higher-order polynomials systematically leads to convergence of the generating function to a Heaviside function in log(x) space. The above two examples demonstrate the method of successive approximations to estimate $k(t)$. However, other methods of successive approximations to functions may be used as well.

Consider the following example shown in FIG. 5 where the top plot shows the $T_2$ distribution, the bottom left plot shows the noiseless echoes $M(t)$, and the bottom right plot shows the echoes after adding white Gaussian noise with standard deviation of 0.02.

Suppose we are interested in estimating the tapered area using the exponential Haar transform defined in Table 2. The top plot of FIG. 6 shows the $T_2$ distribution superimposed by the function $K(T_2,T_c)$ and the bottom plot shows the resulting product. We are interested in estimating the tapered area given by the area under the curve in the bottom plot, that is $$A = \int_0^\infty K(T_2, T_c) f(T_2) dT_2$$

where $K(T_2,T_c)$ is given in Table 2. For this particular example and for $T_c=1$, the true area is) A=0.0594.)

This tapered area can also be estimated directly from the echoes by using the expression $$\hat{A} = \int_0^\infty k(t, T_c) G(t) dt.$$

where $k(t,T_c)$ is defined in Table 2.

By approximating this integral using the trapezoidal rule we find that $\hat{A}=0.0595$.

We illustrate below the performance of integral transforms on simulated data. We simulate measurements from different models with different noise realizations, and different levels of noise. Specifically, consider the 4 models in FIG. 7. For each of these models we generated the echoes and added 30 realizations of random noise. For each of these realizations we estimated the tapered areas. Table 2 summarizes the results showing the mean and standard deviation of the estimated area for the different models and for different levels of noise. The results in this table show that the integral transform method gives an unbiased estimate of the true tapered area. We have also included the results using the standard inverse Laplace transform. In this particular series of examples, the estimates using the integral transform method had either reduced bias or variance or both.

TABLE 2

Estimated tapered areas

| | | NSR = 0.02 | | NSR = 0.2 | | NSR = 0.4 | |
|---|---|---|---|---|---|---|---|
| Model | True | Integral Transform | From ILT | Integral Transform | From ILT | Integral Transform | From ILT |
| 1 | 0.059 | 0.06 ± 0.0003 | 0.06 ± 0.0005 | 0.06 ± 0.0013 | 0.061 ± 0.0015 | 0.061 ± 0.0025 | 0.062 ± 0.0024 |
| 2 | 0.206 | 0.206 ± 0.0008 | 0.207 ± 0.0009 | 0.206 ± 0.0031 | 0.207 ± 0.0035 | 0.207 ± 0.0063 | 0.208 ± 0.007 |
| 3 | 0.022 | 0.022 ± 0.0003 | 0.022 ± 0.0002 | 0.022 ± 0.001 | 0.022 ± 0.0009 | 0.022 ± 0.0018 | 0.023 ± 0.0018 |
| 4 | 0.286 | 0.286 ± 0.0004 | 0.286 ± 0.0005 | 0.286 ± 0.0017 | 0.283 ± 0.0023 | 0.285 ± 0.0033 | 0.282 ± 0.0043 |

This table illustrates that the integral transform method is more stable and reliable than the inverse Laplace transform method. That is, it exhibits better accuracy and has a lower error bar of answer product.

We have described a method for computing linear functionals of the distribution function without first computing the distribution of relaxation times. This method involves a linear transform of the measured data using integral transforms. Different linear functionals of the distribution function can be obtained by choosing appropriate functions in the integral transforms. There are two significant advantages of this approach over the traditional algorithm involving inversion of the distribution function from the measured data. First, it is a direct linear transform of the data. Thus, in contrast to the traditional analysis which involves inversion of an ill-conditioned, non-linear problem, the estimates from this method are more accurate. Second, the uncertainty in the linear functional can be obtained in a straight-forward manner as a function of the signal-to-noise ratio (SNR) in the measured data. This approach can also be extended to multiple dimensions such as diffusion-relaxation measurements. This method can be applied to data obtained from a variety of pulse sequences including CPMG, inversion and saturation recovery, and diffusion editing, as well as pulse sequences often deployed down-hole such as EPM According to another embodiment, integral transforms can be computed on data corresponding to longitudinal relaxation time ($T_1$). More specifically, data G(t) may be indicative of what might have been measured by an NMR tool as a result of having applied a pulse sequence to a sample.

Data corresponding to a longitudinal relaxation time ($T_1$) results in an equation similar to (1) with $$G(t) = \int_0^\infty P_\tau(T_1) e^{-t/T_1} f(T_1) dT_1, \quad (54)$$

where the function $P_\tau(T_1)$ depends on the pulse sequence of the NMR equipment used to probe and measure the sample. From eqns. (3) and (54), $$A = \int_0^\infty k(t) G(t) dt \quad (55)$$
$$= \int_0^\infty K(T_1) P_\tau(T_1) f(T_1) dT_1$$

where the functions $k(t)$ and $K(T_1)$ form a Laplace-transform pair, with $$K(T_1) \equiv \int_0^\infty k(t) e^{-t/T_1} dt. \quad (56)$$

Thus, from the RHS of eqn. (55), for a desired linear transformation in the $T_1$ domain, our objective is to construct a function $k(t)$ in the time-domain, so that the scalar product of the function with the measured data allows computation of A, the parameter of interest. According to another embodiment, integral transforms can be computed on data corresponding to diffusion coefficient (D). Data corresponding to diffusion coefficient (D) results in an equation similar to (1) with $$G(t) = \int_0^\infty P_\tau(D) e^{-Dt} f(D) dD, \quad (57)$$

where the function $P_\tau(D)$ depends on the pulse sequence of the NMR equipment used to probe and measure the sample. From eqns. (3) and (57), $$A = \int_0^\infty k(t) G(t) dt \quad (58)$$
$$= \int_0^\infty K(D) P_\tau(D) f(D) dD$$

where the functions $k(t)$ and $K(D)$ form a Laplace-transform pair, with $$K(D) \equiv \int_0^\infty k(t) e^{-Dt} dt. \quad (59)$$

According to other embodiments, the embodiments described above may be extended to extract multidimensional distributions such as (by way of example only) diffusion-$T_2$ distribution functions, diffusion-$T_1$ distribution functions and $T_1$-$T_2$ distribution functions. This may be done by reference to the previous embodiments and by reference to methods such as those described in M. D. Hurlimann and L. Venkataramanan, "Quantitative Measurement of Two-Dimensional Distribution Functions of Diffusion and Relaxation in Grossly Inhomogenous Fields", *Journal of Magnetic Resonance* 157, 31-42 (2002); Y.-Q. Song et al., "$T_1$-$T_2$ Correlation Spectra Obtained Using a Fast Two-Dimensional Laplace Inversion," *Journal of Magnetic Resonance* 154, 1-8 (2002); and R. L. Kleinberg et al., "Nuclear Magnetic Resonance of Rocks: $T_1$ vs. $T_2$," *SPE* 26470 (1993). All three of these publications are incorporated by reference herein. Thus, by way of example, the measured nuclear magnetic resonance (NMR) data resulting from a multi-component sample can be denoted by $G(t,\tau)$ which represents a multidimensional, multi-exponential decay, with time constants $T_1$ and $T_2$ and amplitudes $f(T_1,T_2)$ $$G(t,\tau) = \int_0^\infty \int_0^\infty P_\tau(T_2) e^{-t/T_2} e^{-\tau/T_1} f(T_1, T_2) dT_1 dT_2 \quad (60)$$

where the function $P_\tau(T_2)$ is referred to as the polarization factor and depends on the pulse sequence of the NMR equipment used to probe and measure the sample. The integral transform of the data $G(t)$ is denoted by $\Im\{G(t)\} = A$, and defined by $$\Im\{G(t,\tau)\} = A = \int_0^\infty \int_0^\infty k(t,\tau) G(t,\tau) dt d\tau \quad (61)$$

From eqns. (60) and (61), $$A = \int_0^\infty \int_0^\infty k(t,\tau) G(t,\tau) dt d\tau \quad (62)$$
$$= \int_0^\infty K(T_1, T_2) P_\tau(T_2) f(T_1, T_2) dT_1 dT_2$$

where the functions $k(t,\tau)$ and $K(T_1,T_2)$ form a Laplace-transform pair, with $$K(T_1, T_2) \equiv \int_0^\infty \int_0^\infty k(t,\tau) e^{-t/T_1} e^{-t/T_2} d\tau dt. \quad (63)$$

According to other embodiments, the embodiments described above may be extended to obtain linear functionals of multidimensional distributions such as (by way of example only) diffusion-$T_2$, diffusion-$T_1$-$T_2$ distribution functions, diffusion-$T_1$-$T_2$ functions as a function of depth of investigation as well as diffusion-$T_1$-$T_2$ functions as a function of azimuth. That is, the multiple dimensions for some embodiments may be selected from the group consisting of 2-D (D-T1, D-T2, T1-T2), 3D (D-T1-T2) and 4D measurements (D-T1-T2, D-T1-T2-depth of investigation, D-T1-T2-azimuth). For example, the Laplace transform pair in two dimensions will be as follows (for T1-T2 measurements)

$$K(x, y) \equiv \int_0^\infty \int_0^\infty k(t,\tau) e^{-\tau/x} e^{-t/y} d\tau dt. \quad (64)$$

or as follows (for D-T2, D-T1 measurements)

$$K(x, y) \equiv \int_0^\infty \int_0^\infty k(t,\tau) e^{-tx} e^{-t \cdot y} d\tau dt. \quad (65)$$

The Laplace transform pair in three dimensions may be as follows.

$$K(x, y, z) \equiv \int_0^\infty \int_0^\infty \int_0^\infty k(t, \tau_1, \tau_2) e^{-tx} e^{-\tau_1/y} e^{-\tau_2/z} dt d\tau_1 d\tau_2 \quad (66)$$

This may be done by reference to the previous embodiments and by reference to knowledge in the art such as described in M. D. Hurlimann and L. Venkataramanan, "Quantitative Measurement of Two-Dimensional Distribution Functions of Diffusion and Relaxation in Grossly Inhomogenous Fields," *Journal of Magnetic Resonance* 157, 31-42 (2002); Y.-Q. Song et al., "$T_1$-$T_2$ Correlation Spectra Obtained Using a Fast Two-Dimensional Laplace Inversion and L. Venkataramanan, Y. Q. Song and M. D. Hurlimann "Solving Fredholm integrals of the first kind with tensor product structure in 2 and 2.5 dimensions", vol. 50, No. 5, May 2002 and N. Heaton et al, "4D NMR—Applications of the radial dimension in magnetic resonance logging," *Petrophysics*, 49, 2 (2008). All four of these publications are incorporated by reference herein.

What is claimed is:

1. A method of recovering hydrocarbons from a formation, comprising:
   locating a nuclear magnetic resonance (NMR) apparatus downhole into a subterranean formation;
   performing a nuclear magnetic resonance (NMR) measurement on the subterranean formation using the NMR apparatus to obtain NMR data in a measurement-domain, wherein the mechanical NMR apparatus performs the NMR measurement on the subterranean formation by applying a NMR pulse sequence to the subterranean formation;
   calculating rock permeability or hydrocarbon viscosity for a desired area within a distribution-domain by computing with a computer an integral transform for the desired area on the NMR data in the measurement-domain, wherein the desired area within the distribution-domain is a subset of the distribution domain; and
   using the rock permeability or hydrocarbon viscosity to improve recovery of hydrocarbons from of the formation.

2. The method of claim 1, further comprising:
   computing a function k(t) in the measurement-domain for the desired area K(x) within the distribution-domain.

3. The method of claim 2, wherein computing the function k(t) comprises satisfying the relationship:

$$K(x) \equiv \int_0^\infty k(t) e^{-t/x} dt.$$

4. The method of claim 3, wherein x comprises at least one of $T_1$ relaxation time, $T_2$ relaxation time, and diffusion.

5. The method of claim 2, wherein computing the function in the measurement-domain k(t) for the desired area K(x) within the distribution-domain comprises using a closed-form analytical solution.

6. The method of claim 2, wherein computing the function in the measurement-domain k(t) for the desired area K(x) within the distribution-domain comprises using a closed-form numerical solution.

7. The method of claim 2, wherein computing the function in the measurement-domain k(t) for the desired area K(x) within the distribution-domain comprises using a method of successive approximations.

8. The method of claim 2, wherein computing the function in the measurement-domain k(t) for the desired area K(x) within the distribution-domain comprises using a convolution analysis.

9. The method of claim 2, wherein computing a function k(t) in the measurement-domain for the desired area K(x) within the distribution-domain comprises using a linear transform.

10. The method of claim 9, wherein the desired area K(x) within the distribution-domain comprises tapered and sharp areas.

11. The method of claim 1, wherein the measurement-domain comprises a time domain.

12. The method of claim 1, wherein the NMR measurement is de-noised before calculating the rock permeability or hydrocarbon viscosity.

13. The method of claim 1, wherein uncertainty of the rock permeability or hydrocarbon viscosity is quantified as a function of signal-to-noise ratio (SNR) of the NMR measurement.

14. The method of claim 1, wherein computing the function in the measurement-domain k(t) for the desired area K(x) within the distribution-domain comprises obtaining the function as a convolution.

15. The method of claim 1, wherein the NMR data comprises data that is fully or partially polarized.

16. The method of claim 1, wherein the NMR measurements comprise at least one of (i) NMR core measurements in a lab, (ii) downhole NMR logging measurements, and (iii) downhole NMR flowline measurements.

17. The method of claim 1, further comprising:
   approximating a polarization factor; and
   calculating the rock permeability or hydrocarbon viscosity using the polarization factors.

* * * * *